(12) United States Patent
Peidous et al.

(10) Patent No.: US 7,902,008 B2
(45) Date of Patent: Mar. 8, 2011

(54) METHODS FOR FABRICATING A STRESSED MOS DEVICE

(75) Inventors: Igor Peidous, Fishkill, NY (US); Mario M. Pelella, Mountain View, CA (US)

(73) Assignee: GlobalFoundries Inc., Grand Cayman (KY)

( * ) Notice: Subject to any disclaimer, the term of this patent is extended or adjusted under 35 U.S.C. 154(b) by 642 days.

(21) Appl. No.: 11/197,046

(22) Filed: Aug. 3, 2005

(65) Prior Publication Data

US 2007/0032024 A1    Feb. 8, 2007

(51) Int. Cl.
*H01L 21/00* (2006.01)
*H01L 21/336* (2006.01)

(52) U.S. Cl. ......... 438/166; 438/181; 438/300; 438/308; 438/938; 257/18; 257/19; 257/E21.093; 257/E21.182; 257/E21.207

(58) Field of Classification Search ........... 257/E21.431, 257/19, E33.009, E31.035, E29.104, E29.193, 257/E21.093, E21.102, E21.182, E21.207; 438/142, 149–151, 162–163, 166–168, 174, 438/181, 187, 194, 197–198, 289–300, 306, 438/308, 795, 938, FOR. 487
See application file for complete search history.

(56) References Cited

U.S. PATENT DOCUMENTS

| | | | | |
|---|---|---|---|---|
| 6,048,756 | A * | 4/2000 | Lee et al. | 438/151 |
| 6,165,826 | A | 12/2000 | Chau et al. | |
| 6,214,679 | B1 * | 4/2001 | Murthy et al. | 438/299 |
| 6,713,802 | B1 * | 3/2004 | Lee | 257/295 |
| 7,232,730 | B2 * | 6/2007 | Chen et al. | 438/301 |
| 7,435,656 | B2 * | 10/2008 | Shima | 438/296 |
| 7,465,620 | B2 * | 12/2008 | Ko et al. | 438/199 |
| 2003/0136985 | A1 * | 7/2003 | Murthy et al. | 257/288 |
| 2004/0014276 | A1 | 1/2004 | Murthy et al. | |
| 2004/0173815 | A1 * | 9/2004 | Yeo et al. | 257/192 |
| 2004/0259315 | A1 * | 12/2004 | Sakaguchi et al. | 438/285 |
| 2004/0262683 | A1 | 12/2004 | Bohr et al. | |
| 2005/0035369 | A1 | 2/2005 | Lin et al. | |
| 2005/0035409 | A1 | 2/2005 | Ko et al. | |
| 2005/0059228 | A1 | 3/2005 | Bu et al. | |

(Continued)

FOREIGN PATENT DOCUMENTS

DE    112005001029 T5    2/2007

(Continued)

OTHER PUBLICATIONS

International Search Report for PCT/US2006/028197, mailed Jan. 22, 2007.

(Continued)

*Primary Examiner* — Matthew C Landau
*Assistant Examiner* — Maliheh Malek
(74) *Attorney, Agent, or Firm* — Ingrassia Fisher & Lorenz, P.C.

(57) ABSTRACT

A method for fabricating a stressed MOS device in and on a semiconductor substrate is provided. The method comprises the steps of forming a gate electrode overlying the semiconductor substrate and etching a first trench and a second trench in the semiconductor substrate, the first trench and the second trench formed in alignment with the gate electrode. A stress inducing material is selectively grown in the first trench and in the second trench and conductivity determining impurity ions are implanted into the stress inducing material to form a source region in the first trench and a drain region in the second trench. To preserve the stress induced in the substrate, a layer of mechanically hard material is deposited on the stress inducing material after the step of ion implanting.

14 Claims, 2 Drawing Sheets

U.S. PATENT DOCUMENTS

| | | | |
|---|---|---|---|
| 2006/0024898 A1* | 2/2006 | Chidambaram et al. | 438/303 |
| 2006/0160314 A1* | 7/2006 | Arghavani | 438/285 |
| 2006/0214198 A1* | 9/2006 | Matsuki et al. | 257/288 |
| 2006/0228863 A1* | 10/2006 | Zhang et al. | 438/300 |
| 2006/0228897 A1* | 10/2006 | Timans | 438/758 |
| 2006/0286729 A1* | 12/2006 | Kavalieros et al. | 438/183 |

FOREIGN PATENT DOCUMENTS

| | | | |
|---|---|---|---|
| JP | 2005-084603 | * | 3/2005 |

OTHER PUBLICATIONS

Ranade, Pushkar et al., "A Novel Elevated Source/Drain PMOSFET Formed by Ge-B/Si Intermixing," IEEE Electron Device Letters, vol. 23, No. 4, Apr. 2002, pp. 218-220.

Ghani, T. et al., "A 90 nm High Volume Manufacturing Logic Technology Featuring Novel 45nin Gate Length Strained Silicon CMOS Transistors," IEDM Technical Digest, Dec. 8, 2003, pp. 978-980.

* cited by examiner

METHODS FOR FABRICATING A STRESSED MOS DEVICE

TECHNICAL FIELD OF THE INVENTION

The present invention generally relates methods for fabricating stressed MOS devices, and more particularly relates to methods for fabricating stressed MOS devices and for preserving the stress and the stress induced enhancement in such devices.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes.

MOS transistors, in contrast to bipolar transistor, are majority carrier devices. The gain of an MOS transistor, usually defined by the transconductance ($g_m$), is proportional to the mobility of the majority carrier in the transistor channel. The current carrying capability of an MOS transistor is proportional to the mobility of the majority carrier in the channel. The mobility of holes, the majority carrier in a P-channel MOS transistor can be increased by applying a compressive longitudinal stress to the channel. The mobility of electrons, the majority carrier in an N-channel MOS transistor can be increased by applying a tensile transverse stress to the channel. In a silicon MOS transistor such stresses can be applied to the channel of an MOS transistor by appropriately embedding a stress inducing material such as SiGe in the silicon substrate of the transistor. The stresses are caused by lattice mismatches between the SiGe and the host silicon material. The intrinsic stresses in the SiGe redistribute into the adjacent areas of the host substrate, namely into the channel region of the MOS transistor. Unfortunately, one of the problems with embedded SiGe technology is the mechanical stability of the SiGe layers. At elevated temperatures the intrinsic stress in the SiGe layers relaxes due to dislocation generation. The decrease in stress, in turn, causes a reduction in the stress induced mobility increase, and hence a deterioration of device performance.

Accordingly, it is desirable to provide methods for fabricating stressed MOS devices that prevent stress relaxation. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

A method for fabricating a stressed MOS device in and on a semiconductor substrate is provided. The method comprises the steps of forming a gate electrode overlying the semiconductor substrate and etching a first trench and a second trench in the semiconductor substrate, the first trench and the second trench formed in alignment with the gate electrode. A stress inducing material is selectively grown in the first trench and in the second trench and conductivity determining impurity ions are implanted into the stress inducing material to form a source region in the first trench and a drain region in the second trench. To preserve the stress induced in the substrate, a layer of mechanically hard material is deposited overlying the stress inducing material after the step of ion implanting.

BRIEF DESCRIPTION OF THE DRAWINGS

The present invention will hereinafter be described in conjunction with the following drawing figures, wherein like numerals denote like elements, and wherein FIGS. 1-6 schematically illustrate, in cross section, a stressed MOS device and methods for its fabrication in accordance with various embodiments of the invention.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-6 illustrate a stressed MOS device 30 and method steps for fabricating such an MOS device in accordance with various embodiments of the invention. In this illustrative embodiment stressed MOS device 30 is illustrated by a single P-channel MOS transistor. An integrated circuit formed from stressed MOS devices such as device 30 can include a large number of such transistors, and may also include unstressed P-channel MOS transistors and stressed and unstressed N-channel transistors as well.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
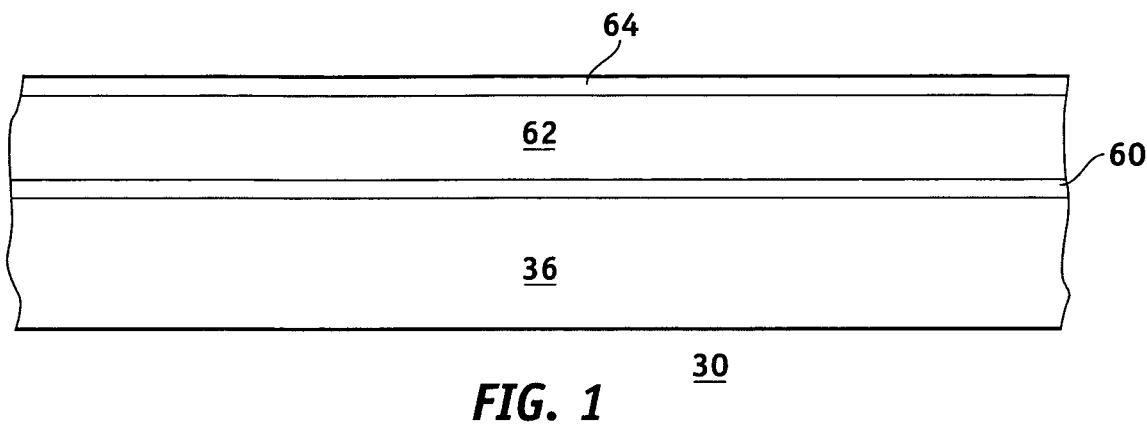

As illustrated in FIG. 1, the manufacture of a stressed MOS device 30 in accordance with an embodiment of the invention begins with providing a semiconductor substrate 36. The semiconductor substrate is preferably a monocrystalline silicon substrate wherein the term "silicon substrate" is used herein to encompass the relatively pure silicon materials typically used in the semiconductor industry. Semiconductor substrate 36 will herein be referred to, for ease of discussion but without limitation, alternatively as a silicon substrate or as a semiconductor substrate. Silicon substrate 36 may be a bulk silicon wafer or a thin layer of silicon on an insulating layer (commonly know as silicon-on-insulator or SOI) that, in turn, is supported by a silicon carrier wafer, but is here illustrated, without limitation, as a bulk silicon wafer. Preferably the silicon wafer has (100) or (110) orientation and at least the portion of the wafer in which MOS device 30 is to be fabricated is doped with N-type impurity dopants (for example, an N-well). The N-well can be doped to the appropriate conductivity, for example, by ion implantation. Shallow trench isolation (STI) (not illustrated) is formed in the semiconductor substrate to electrically isolate individual devices as required by the circuit function being implemented. As is well known, there are many processes that can be used to form the STI, so the process need not be described here in detail. In general, STI includes a shallow trench that is etched into the surface of the semiconductor substrate and that is subsequently filled with an insulating material. After the trench is filled with the insulating material, the surface is usually planarized, for example by chemical mechanical planarization (CMP).

A layer of gate insulator 60 is formed on the surface of silicon substrate 36. The gate insulator may be a thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). The gate insulator material is typically 1-10 nanometers (nm) in thickness. In accordance with one embodiment of the invention a layer of polycrystalline silicon 62 is deposited onto the layer of gate insulator. The layer of polycrystalline silicon is preferably deposited as undoped polycrystalline silicon and is subsequently impurity doped by ion implantation. A layer 64 of hard mask material such as silicon oxide, silicon nitride, or silicon oxynitride can be deposited onto the surface of the polycrystalline silicon. The polycrystalline material can be deposited to a thickness of about 100 nm by LPCVD by the hydrogen reduction of silane. The hard mask material can be deposited to a thickness of about 50 nm, also by LPCVD.

Figure 2:
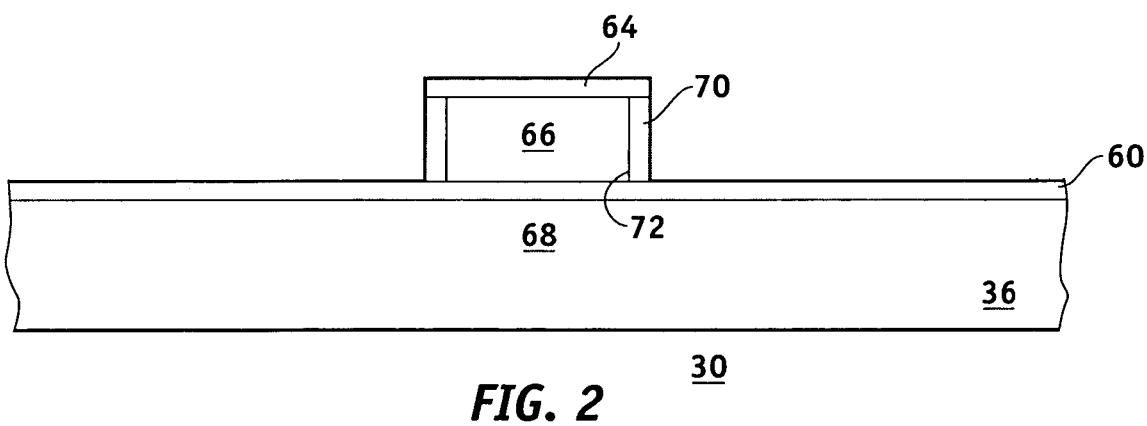

Hard mask layer 64 and underlying layer of polycrystalline silicon 62 are photolithographically patterned to form a P-channel MOS transistor gate electrode 66 as illustrated in FIG. 2. Gate electrode 66 overlies the portion of semiconductor substrate 36 that will form channel 68 of P-channel MOS transistor 30. The polycrystalline silicon can be etched in the desired pattern by, for example, plasma etching in a Cl or HBr/$O_2$ chemistry and the hard mask can be etched, for example, by plasma etching in a $CHF_3$, $CF_4$, or $SF_6$ chemistry. Following the patterning of the gate electrode, in accordance with one embodiment of the invention, a thin layer 70 of silicon oxide is thermally grown on the opposing sidewalls 72 of gate electrode 66 by heating the polycrystalline silicon in an oxidizing ambient. Layer 70 can be grown to a thickness of about 2-5 nm. Gate electrode 66 and layer 70 can be used as an ion implant mask to form source and drain extensions (not illustrated) of the MOS transistor. The possible need for and method of forming multiple source and drain regions are well known, but are not germane to this invention and hence need not be explained herein.

Figure 3:
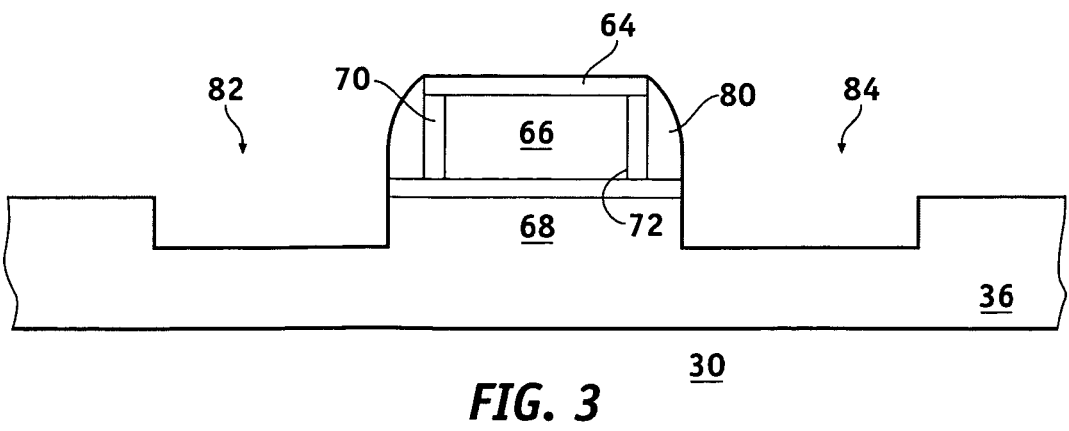

In accordance with one embodiment of the invention, as illustrated in FIG. 3, sidewall spacers 80 are formed on the opposing sidewalls 72 of gate electrode 66. The sidewall spacers can be formed of silicon nitride, silicon oxide, or the like by depositing a layer of the spacer material over the gate electrodes and subsequently anisotropically etching the layer, for example by reactive ion etching. Sidewall spacers 80, gate electrode 66, and the hard mask on the top of the gate electrode are used as an etch mask to etch trenches 82 and 84 in the silicon substrate in spaced apart self alignment with P-channel gate electrode 66. The trenches intersect the ends of channel 68. The trenches can be etched, for example, by plasma etching using a Cl or HBr/$O_2$ chemistry. Preferably each of the trenches has a depth or about 0.04-0.2 μm.

Figure 4:
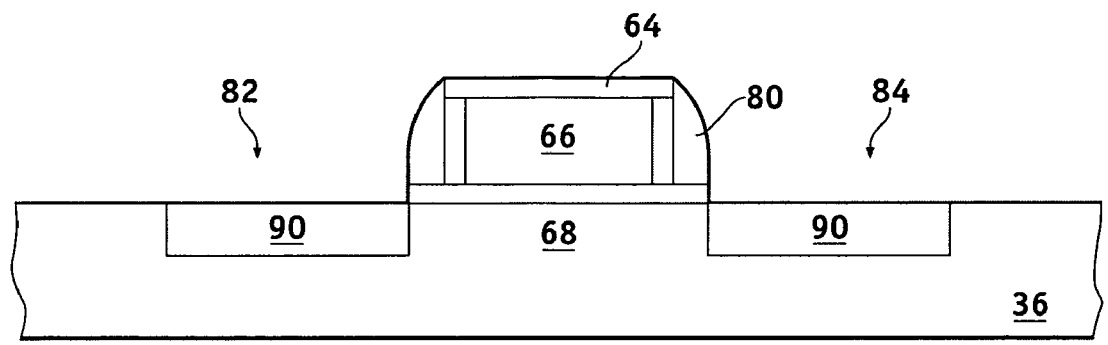

As illustrated in FIG. 4, the trenches are filled with a layer of stress inducing material 90. The stress inducing material can be any monocrystalline material that can be grown on the silicon substrate with a different lattice constant than the lattice constant of silicon. The difference in lattice constant of the two juxtaposed materials generates a stress at the interface between the two materials that is redistributed in the host material. Preferably the stress inducing material causes the silicon host to deform elastically so that the silicon is stressed, but remains a substantially defect free perfect crystal. Defects can cause a decrease or relief of the stress. The stress inducing material can be, for example, monocrystalline silicon germanium (SiGe) having about 10-25 atomic percent germanium or monocrystalline silicon containing about 1-4 atomic percent of substitutional carbon and preferably less than about 2 atomic percent substutional carbon. Preferably the stress inducing material is epitaxially grown by a selective growth process. Methods for epitaxial growth of these materials on a silicon host in a selective manner are will known and need not be described herein. In the case of SiGe, for example, the SiGe has a lattice constant greater than the lattice constant of silicon, and this creates a compressive longitudinal stress in transistor channel 68. The compressive longitudinal stress increases the mobility of holes in channel 68 and hence improves the performance of a P-channel MOS transistor.

Figure 5:
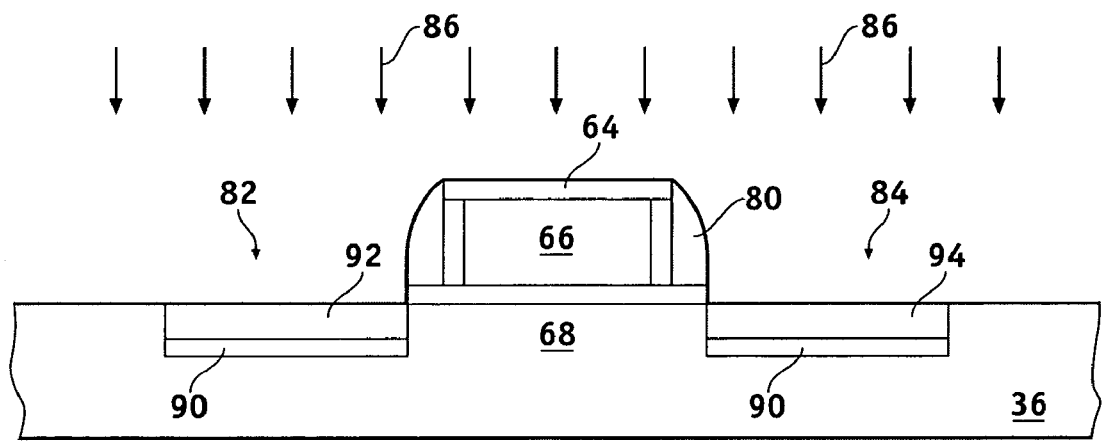

Following the growth of the stress inducing material in trenches 82 and 84, P-type conductivity determining ions are implanted into the stress inducing material as indicated by arrows 86 to form a source region 92 and a drain region 94 of P-channel MOS transistor 30 as illustrated in FIG. 5. To become electrically active, the implanted ions must be annealed, and such anneal is usually carried out soon after the implantation is completed. Elevated temperatures, however, cause intrinsic stresses in the SiGe or other stress inducing material to relax due to the generation of dislocations that are nucleated on the surface and the creation of steps at the surface of the SiGe.

Figure 6:
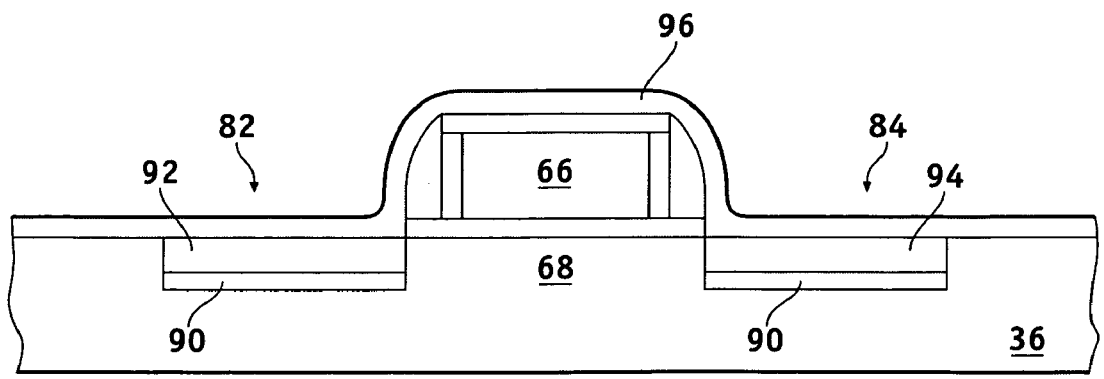

In accordance with an embodiment of the invention, as illustrated in FIG. 6, the relaxation of stress in channel 68 is prevented by depositing a layer 96 with high mechanical strength onto the surface of the stress inducing material. The layer of high mechanical strength retards step formation and prevents dislocation nucleation and propogation at the surface of the stress inducing material. The layer of high mechanical strength is applied before the annealing of the ion implantation or any other high temperature steps. After application of layer 96 the device can be subjected to high temperatures and the stress will be preserved. Layer 96 can be any material that can be deposited at a relatively low temperature and that has a Young's modulus greater than and preferably much greater than the Young's modulus of the stress inducing material. For example, for use with SiGe which has a Young's modulus of about 150 GPa, silicon nitride (Young's modulus about 350 GPa), silicon carbide (Young's modulus between about 400 and 750 GPa) and diamond-like carbon (Young's modulus up to 800 GPa) are suitable materials for layer 96. As used herein, low temperature means any temperature less than about 600° C., and high temperature means any temperature greater than about 900° C. Layer 96 can be deposited by CVD, LPCVD, or PECVD. A layer of silicon nitride can be deposited, for example by PECVD at a temperature of about 450° C. by the plasma enhanced reaction of dichlorosilane and ammonia. Similarly, silicon carbide can be deposited by using the vapor phase $SiCl_4$ and methane at 550° C. and PECVD diamond-like carbon can be deposited using a gas mixture of Ar, $H_2$, $SiH_4$ and $C_2H_2$ at 200° C. It may be advantageous, in accordance with an alternate embodiment of the invention (not illustrated), to first provide a layer of pad oxide having a thickness of, for example, 2-5 nm beneath layer 96 of high mechanical strength. The layer of pad oxide serves to prevent any reaction between, for example, the silicon nitride and the underlying semiconductor material.

Stressed MOS device 30 can be completed by well known steps (not illustrated) such as depositing a layer of dielectric material over layer 96, etching opening through the dielectric material and layer 96 to expose portions of the source and drain regions, and forming metallization that extends through the openings to electrically contact the source and drain regions. Further layers of interlayer dielectric material, additional layers of interconnect metallization, and the like may also be applied and patterned to achiever the proper circuit function of the integrated circuit being implemented.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stressed MOS device in and on a semiconductor substrate comprising the steps of:
    forming a gate electrode overlying the semiconductor substrate;
    etching a first trench and a second trench in the semiconductor substrate, the first trench and the second trench formed in alignment with the gate electrode;
    selectively growing a stress inducing material in the first trench and in the second trench to create a stress condition in the semiconductor substrate;
    ion implanting conductivity determining impurity ions into the stress inducing material to form a source region in the first trench and a drain region in the second trench, wherein the gate electrode defines a channel region in the semiconductor substrate between the source region and the drain region; and
    forming a layer of mechanically hard material overlying and in direct contact with a substantially planar surface of the stress inducing material after the step of ion implanting conductivity determining impurity ions into the stress inducing material to form the source region and the drain region and before any step comprising heating to a temperature greater than about 600° C. to prevent dislocation nucleation at the substantially planar surface of the stress inducing material during subsequent heating steps; and
    then electrically activating the conductivity determining impurity ions in the source region and the drain region by heating the stress inducing material to a temperature greater than about 600° C. after the step of forming the layer of mechanically hard material without decreasing stress applied along the channel region by the stress inducing material.

2. The method of claim 1 wherein the step of selectively growing comprises the step of epitaxially growing a layer of monocrystalline SiGe.

3. The method of claim 2 wherein the step of forming a layer of mechanically hard material comprises the step of depositing a layer of material having a Young's modulus greater than the Young's modulus of monocrystalline SiGe.

4. The method of claim 3 wherein the step of forming a layer of mechanically hard material comprises the step of forming a layer of material selected from the group consisting of silicon nitride, silicon carbide, and diamond-like carbon.

5. The method of claim 1 wherein the step of selectively growing a stress inducing material comprises the step of selectively growing a stress inducing material characterized by a first Young's modulus and wherein the step of forming a layer of mechanically hard material comprises the step of forming a layer of mechanically hard material characterized by a second Young's modulus greater than the first Young's modulus.

6. The method of claim 1 wherein the step of forming a layer of mechanically hard material comprises the step of forming a layer of material selected from the group consisting of silicon nitride, silicon carbide, and diamond-like carbon.

7. A method for fabricating a stressed MOS device comprising the steps of:
    providing a monocrystalline semiconductor substrate;
    creating a stress condition in the monocrystalline semiconductor substrate by epitaxially growing a stress inducing monocrystalline semiconductor material on the monocrystalline semiconductor substrate, the stress inducing monocrystalline semiconductor material having a lattice mismatch with the monocrystalline semiconductor substrate;
    ion implanting conductivity determining impurity ions into the stress inducing monocrystalline semiconductor material to form a source region and a drain region;
    preserving the stress condition in the monocrystalline semiconductor substrate by depositing a film of mechanically hard material on and in direct contact with a substantially planar surface of the stress inducing monocrystalline semiconductor material that forms the source region and the drain region before the stress inducing monocrystalline semiconductor material is subjected to a temperature in excess of about 900° C. to prevent dislocation nucleation at the substantially planar surface of the stress inducing monocrystalline semiconductor material during subsequent heating steps; and
    then electrically activating the conductivity determining impurity ions in the source region and the drain region by heating the stress inducing monocrystalline semiconductor material to a temperature greater than about 900° C. after the step of preserving the stress condition without decreasing the stress condition in the monocrystalline semiconductor substrate that is caused by the stress inducing monocrystalline semiconductor material.

8. The method of claim 7 wherein the step of providing a monocrystalline semiconductor substrate comprises the step of providing a monocrystalline silicon substrate and wherein the step of creating a stress condition comprises the step of selectively growing an epitaxial layer of monocrystalline SiGe on the monocrystalline silicon substrate.

9. The method of claim 7 wherein the step of preserving the stress comprises the step of depositing a layer of material selected from the group consisting of silicon nitride, silicon carbide, and diamond-like carbon.

10. The method of claim 7 further comprising the step of ion implanting conductivity determining ions into the monocrystalline SiGe to form source and drain regions of the stressed MOS device.

11. A method for fabricating a stressed MOS device comprising the steps of:
    providing a monocrystalline silicon substrate;
    forming a gate electrode overlying the monocrystalline silicon substrate;
    etching a first trench and a second trench in the monocrystalline silicon substrate, the first trench and the second trench formed in alignment with the gate electrode;
    selectively growing a stress inducing monocrystalline silicon material containing at least 2% carbon in the first trench and in the second trench, wherein the stress inducing monocrystalline silicon material is lattice mismatched with the monocrystalline silicon substrate to cause a stress condition in the monocrystalline silicon substrate;

ion implanting conductivity determining impurity ions into the stress inducing monocrystalline silicon material to form a source region in the first trench and a drain region in the second trench, wherein the gate electrode defines a channel region in the monocrystalline silicon substrate between the source region and the drain region; and forming a layer of silicon carbide material overlying and in direct contact with a substantially planar surface of the stress inducing monocrystalline silicon material after the step of ion implanting conductivity determining impurity ions into the stress inducing monocrystalline silicon material to form the source region and the drain region and before any step comprising heating the stress inducing monocrystalline silicon material to a temperature greater than about 600° C. to prevent dislocation nucleation at the substantially planar surface of the stress inducing monocrystalline silicon material during subsequent heating steps, wherein the layer of silicon carbide material is in contact with the monocrystalline silicon material and the monocrystalline silicon substrate and is designed to preserve the stress condition in the monocrystalline silicon substrate during subsequent processing; and then electrically activating the conductivity determining impurity ions in the source region and the drain region by heating the stress inducing monocrystalline silicon material to a temperature greater than about 600° C. after the step of forming the layer of silicon carbide material without decreasing stress applied along the channel region by the stress inducing monocrystalline silicon material.

12. The method of claim 11, wherein the stress inducing monocrystalline silicon material has a first Young's modulus, and wherein the layer of silicon carbide material has a second Young's modulus greater than the first Young's modulus.

13. A method for fabricating a stressed MOS device comprising the steps of:

providing a monocrystalline silicon substrate;

forming a gate electrode overlying the monocrystalline silicon substrate;

etching a first trench and a second trench in the monocrystalline silicon substrate, the first trench and the second trench formed in alignment with the gate electrode;

selectively growing a stress inducing monocrystalline silicon material containing at least 2% carbon in the first trench and in the second trench, wherein the stress inducing monocrystalline silicon material is lattice mismatched with the monocrystalline silicon substrate to cause a stress condition in the monocrystalline silicon substrate;

ion implanting conductivity determining impurity ions into the stress inducing monocrystalline silicon material to form a source region in the first trench and a drain region in the second trench, wherein the gate electrode defines a channel region in the monocrystalline silicon substrate between the source region and the drain region; and forming a layer of diamond-like carbon material overlying and in direct contact with a substantially planar surface of the stress inducing monocrystalline silicon material after the step of ion implanting conductivity determining impurity ions into the stress inducing monocrystalline silicon material to form the source region and the drain region and before any step comprising heating the stress inducing monocrystalline silicon material to a temperature greater than about 600° C. to prevent dislocation nucleation at the substantially planar surface of the stress inducing monocrystalline silicon material during subsequent heating steps, wherein the layer of diamond-like carbon material is in contact with the monocrystalline silicon material and the monocrystalline silicon substrate and is designed to preserve the stress condition in the monocrystalline silicon substrate during subsequent processing; and then electrically activating the conductivity determining impurity ions in the source region and the drain region by heating the stress inducing monocrystalline silicon material to a temperature greater than about 600° C. after the step of forming the layer of diamond-like carbon material without decreasing stress applied along the channel region by the stress inducing monocrystalline silicon material.

14. The method of claim 13, wherein the stress inducing monocrystalline silicon material has a first Young's modulus, and wherein the layer of diamond-like carbon material has a second Young's modulus greater than the first Young's modulus.

* * * * *